United States Patent [19]

Fujita

[11] Patent Number: 4,651,113
[45] Date of Patent: Mar. 17, 1987

[54] AMPLITUDE STABILIZED CRYSTAL OSCILLATOR

[75] Inventor: Kouichi Fujita, Yokohama, Japan

[73] Assignee: Fujitsu Limited, Kawasaki, Japan

[21] Appl. No.: 842,353

[22] Filed: Mar. 18, 1986

Related U.S. Application Data

[63] Continuation of Ser. No. 498,562, May 26, 1983, abandoned.

[30] Foreign Application Priority Data

May 26, 1982 [JP] Japan .................................. 57-88009

[51] Int. Cl.$^4$ ........................... H03B 5/36; H03L 5/00
[52] U.S. Cl. ............................. 331/109; 331/116 FE; 331/183
[58] Field of Search ............ 331/116 FE, 116 R, 109, 331/183, 158

[56] References Cited

U.S. PATENT DOCUMENTS

| | | | |
|---|---|---|---|
| 3,621,468 | 11/1971 | Stechmann | 331/109 |
| 3,676,801 | 7/1972 | Musa | 331/116 FE |
| 3,803,828 | 4/1974 | Keeler et al. | 331/116 FE R |
| 4,193,046 | 3/1980 | Chiba | 331/109 |

FOREIGN PATENT DOCUMENTS 1954068 5/1970 Fed. Rep. of Germany.
2541352 4/1976 Fed. Rep. of Germany.

OTHER PUBLICATIONS

"FET-Controlled Crystal Yields Low Distortion", Hudor, Jr., EDN, Nov., 1980, vol. 25, No. 21, Boston, Mass., p. 201.

Patent Abstracts, vol. 5, No. 66 (E-55)(738), May 2, 1981.

Primary Examiner—Siegfried H. Grimm
Attorney, Agent, or Firm—Staas & Halsey

[57] ABSTRACT

An oscillator circuit in a semiconductor substrate of an integrated circuit, includes a gain correction circuit portion connected between the output terminal of the feedback circuit portion and the input end of the amplifier circuit portion composed of MOS transistors. The gain correction circuit portion suppresses the excessive amplitude of the output signal of the feedback circuit portion, so that the characteristic of the waveform of the output signal of the oscillator device is improved.

4 Claims, 6 Drawing Figures

AMPLITUDE STABILIZED CRYSTAL OSCILLATOR

This is a continuation of co-pending application Ser. No. 498,562 filed on May 26, 1983 and now abandoned.

BACKGROUND OF THE INVENTION (1) Field of the Invention

The present invention relates to an oscillator circuit in a semiconductor integrated circuit. The oscillator device according to the present invention is suitable for an oscillator circuit in which minimum distortion of the waveform of the output signal is required.

(2) Description of the Prior Art

In general, in an oscillator circuit formed in a semiconductor integrated circuit and having a crystal resonator connected externally, the peak-to-peak value of the input signal for the amplifier portion of the oscillator circuit is apt to exceed the voltage range "0-$V_{CC}$" of the voltage source.

This phenomenon in the prior art oscillator circuit will be described with reference to FIGS. 1 and 2. On a P type semiconductor substrate 7, an amplifier circuit 1, composed of a depletion-type metal-oxide semiconductor (MOS) transistor 11 and an enhancement-type MOS transistor 12, and a feedback resistor 21 are provided. The feedback resistor 21 and a resonator element 22 of a crystal or ceramic type constitute a feedback circuit 2. Capacitors 31 and 32 are connected between the terminals of the resonator element 22 and ground. The output of the oscillator circuit is obtained from the connecting point 13 of the transistors 11 and 12 and is supplied through inverters 81 and 82 to a function block 83 as a timing pulse signal.

The operation characteristic of the oscillator circuit is illustrated in FIG. 2. The N-channel MOS transistors 11 and 12 are connected between $V_{CC}$ and $V_{SS}(=0)$.

Under ideal conditions of operation, the waveform of the input signal is shown as $V_i(1)$, which has a peak-to-peak value of $V_{CC}$-$V_{SS}$ and a symmetrical shape with a duty ratio of 50% with respect to the level of the threshold voltage $V_T$. The waveform of $V_i(1)$ is either rectangular or sinuosoidal. The waveform of the output signal is shown as $V_O(1)$, which has a peak-to-peak value of $V_{CC}$-$V_{SS}$ and a rectangular shape with a duty ratio of 50%.

Under practical conditions of operation, the waveform of the input signal tends to become $V_i(2)$, which is shifted considerably to the upper side to give an asymmetrical shape. Hence, the waveform of the output signal tends to become $V_O(2)$, which does not have a duty ratio of 50%.

Although the output of the oscillator circuit of FIG. 1 is supplied through inverters 81 and 82 to a function block 83, such as a microprocessor circuit, such an output signal $V_O(2)$ having a duty ratio significantly less or greater than 50% is unsuitable because the function block 83 is prevented from properly operating.

Hence, the duty ratio of the waveform of the output signal of the oscillator circuit is required to be about 50%. Also, the duty ratio of the waveform of the input signal for the amplifier circuit portion of the oscillator circuit with respect to the input threshold voltage $V_T$ of the amplifier is required to be about 50%. Accordingly, prevention of asymmetry of the input signal for the amplifier portion with respect to the level of the threshold voltage $V_T$ is first required.

In the prior art oscillator circuit, a parasitic diode 5 formed by an N type diffusion region in a P type substrate for forming an input protection circuit (not shown) exists between input node 23 and the gate of the transistor 12, which is connected to the substrate at ground. When the gain of the feedback loop is sufficiently large to cause a large amplitude of the input signal at the input node 23 due to some uncontrollable parasitic reactive elements included in the resonator element 22, the parasitic diode 5 exerts a clamping effect to limit the fall of the waveform $V_i(2)$ at a portion lower than $V_{SS}$ within a predetermined value LIM(5) corresponding to the forward voltage of the diode 5, as illustrated in FIG. 2. However, the parasitic diode 5 does not exert a clamping effect enough to limit the rise of the waveform $V_i(2)$ at the upper portion within a predetermined value. Hence, the shape of the waveform $V_i(2)$ is asymmetrical, as shown in FIG. 2.

To counter the problem of asymmetry of the waveform $V_i(2)$, it has been contemplated to connect a clamping diode 6 to an input terminal 23 of the amplifier circuit 1. The clamping diode 6 would exert a clamping effect to limit the rise of the waveform $V_i(2)$ at the upper portion higher than $V_{CC}$ within a predetermined value LIM(6) corresponding to the forward voltage drop of the diode 6, as indicated by the broken line in FIG. 2. The clamping diode 6 would improve the situation because it would reduce the asymmetry in the waveform $V_i(2)$ with respect to $V_T$.

However, the addition of a clamping diode 6 to the MOS type semiconductor integrated circuit is, in general, considerably difficult from the viewpoint of the manufacturing process and the MOS type integrated circuit structure. The addition of the clamping diode 6 to the input terminal 23 of the amplifier circuit 1 in an integrated circuit has not been realized so far. A discrete diode must be used for this purpose.

SUMMARY OF THE INVENTION

It is the object of the present invention to provide an improved oscillator circuit capable of generating an oscillation output signal having a duty ratio of about 50%, requiring no change of the general manufacturing process of the MOS type integrated circuit, whereby an improvement of the characteristic of the oscillator circuit is achieved without increased manufacturing cost.

According to the present invention, there is provided an oscillator circuit comprising amplifier circuit means; feedback circuit means for receiving the output of the amplifier circuit means; and gain correction circuit means connected between the output terminal of the feedback circuit means and the input terminal of the amplifier circuit means. The gain correction circuit means comprises a circuit for dividing the voltage of the output signal of the feedback circuit means and supplying the divided voltage to the input terminal of the amplifier circuit means. The gain correction circuit means is adapted to suppress the output signal of the feedback circuit means by changing the voltage division ratio of the voltage division circuit in accordance with the amplitude of the output signal of the feedback circuit means when the output signal of the feedback circuit means exceeds a predetermined amplitude.

DESCRIPTION OF THE PREFERRED EMBODIMENT

Figure 1:
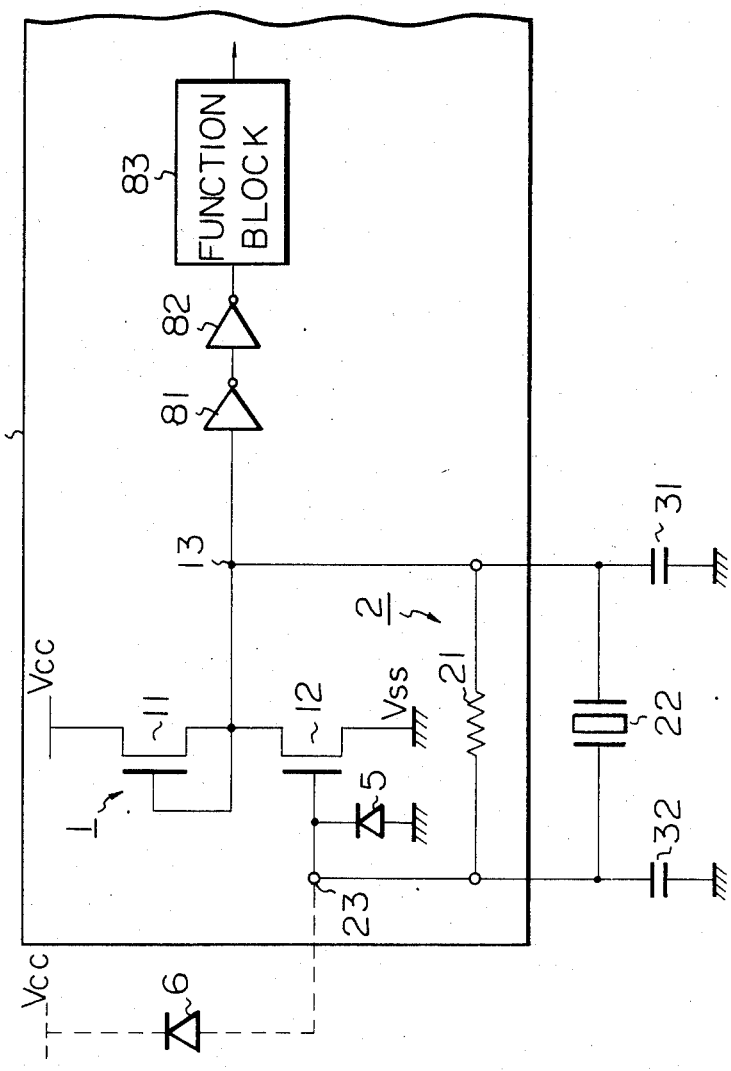
FIG. 1 is a prior art oscillator circuit.
Figure 2:
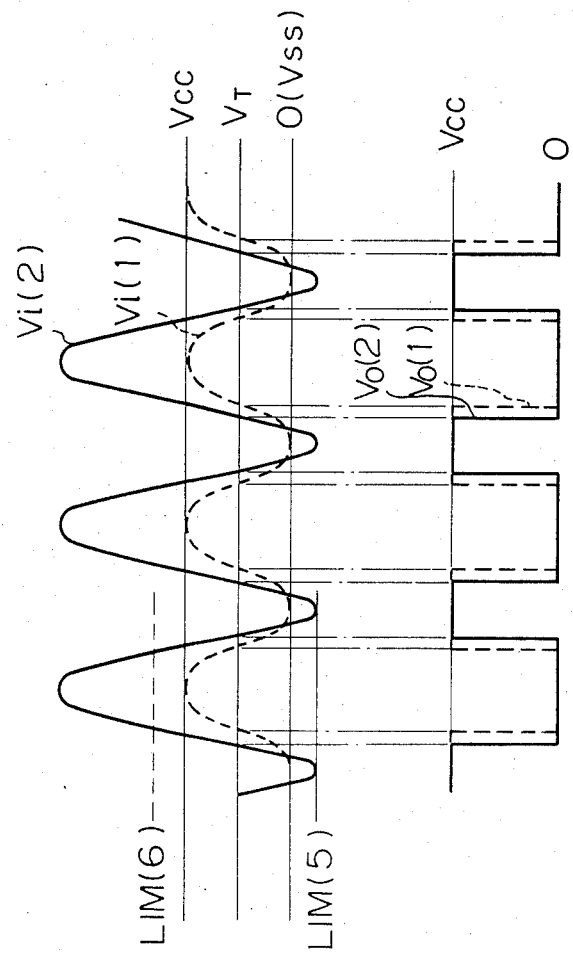
FIG. 2 illustrates the operation characteristics of the oscillator circuit of FIG. 1.
Figure 3:
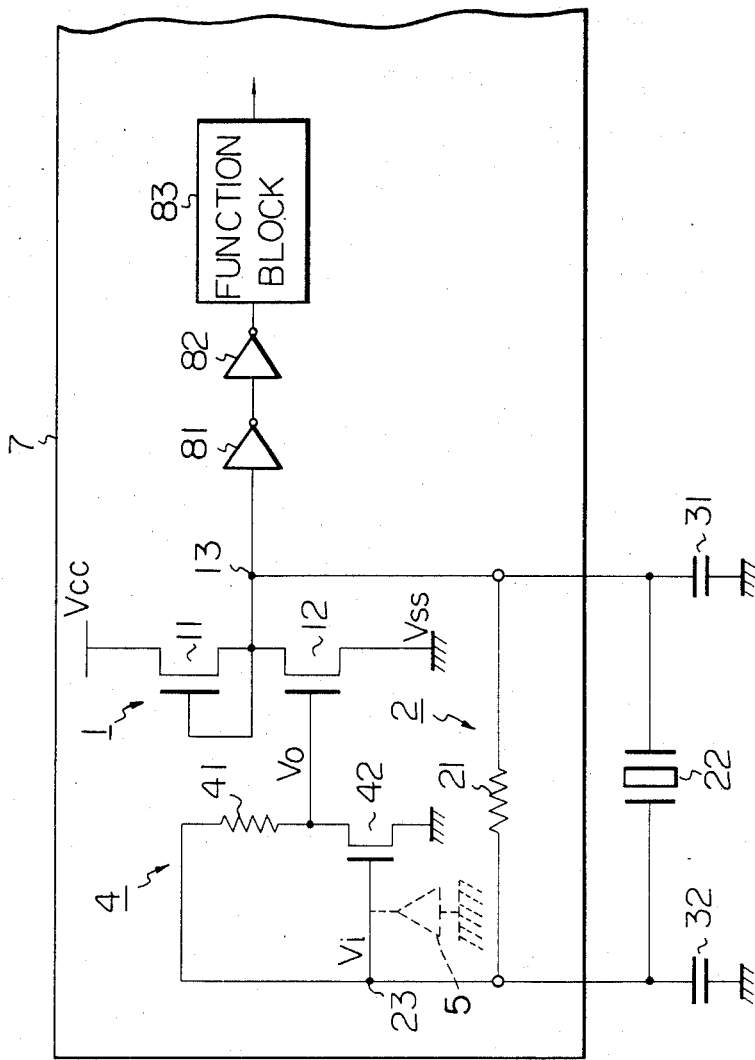
FIG. 3 is an oscillator circuit according to a preferred embodiment of the present invention.

An oscillator circuit according to a preferred embodiment of the present invention is illustrated in FIG. 3.

On a P type semiconductor substrate 7, an amplifier circuit 1 composed of a depletion-type MOS transistor 11 and an enhancement-type MOS transistor 12, a feedback resistor 21, and a gain correction circuit 4 composed of a diffusion resistance element 41 and an enhancement type MOS transistor 42, are provided. All of the MOS transistors are of N channel type. The feedback resistor 21 and a resonator element 22 of a crystal or ceramic type constitute a feedback circuit 2. Capacitors 31 and 32 are connected between the terminals of the resonator element 22 and ground.

The output of the oscillator circuit is obtained from the connecting point 13 of the transistors 11 and 12 and is supplied through inverters 81 and 82 to a function block 83 of, for example, a frequency division circuit and a succeeding microprocessor circuit.

The diffusion resistance element 41 is a resistance element in the form of a diffusion layer in a semiconductor chip in which MOS transistors are formed.

The purpose of the operation of the gain correction circuit 4 is to change the input impedance $Z_i$ in accordance with the change of the input voltage $V_i$ so that the amplitude of the input voltage $V_i$ is suppressed when large. In other words, the circuit 4 controls the feedback gain of the amplifier.

The gate of the transistor 42 is connected to an input terminal 23. A parasitic diode 5 for forming a gate protection element is connected to the input terminal as in the prior art device. The source of the transistor 42 is grounded. The diffusion resistance element 41 is connected between the gate and the drain of the transistor 42. The output voltage $V_O$ obtained from the drain of the transistor 42 is supplied to the gate of the transistor 12 in the amplifier circuit 1.

The operation of the oscillator circuit of FIG. 3 is explained with reference to the graph of FIGS. 4A and 4B. The graphs of FIGS. 4A and 4B are based on results of calculations and verified by the results of experiments carried out by the inventor.

Figure 4A:
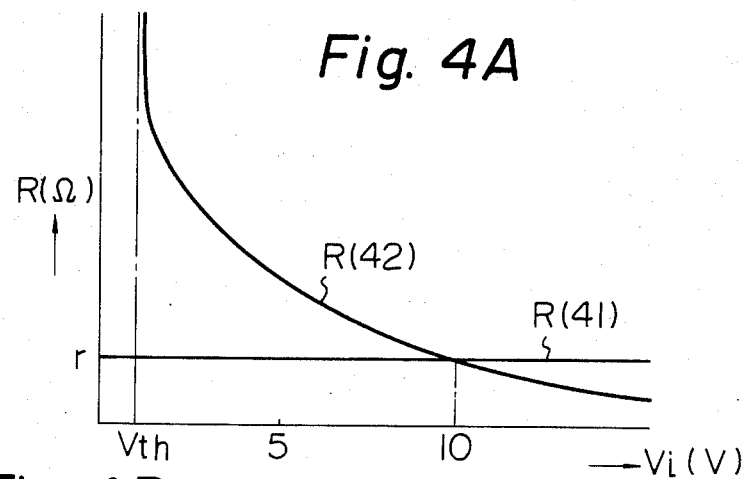
FIGS. 4A, 4B, and 5 illustrate the operation characteristics of the oscillator circuit of FIG. 3.
Figure 4B:
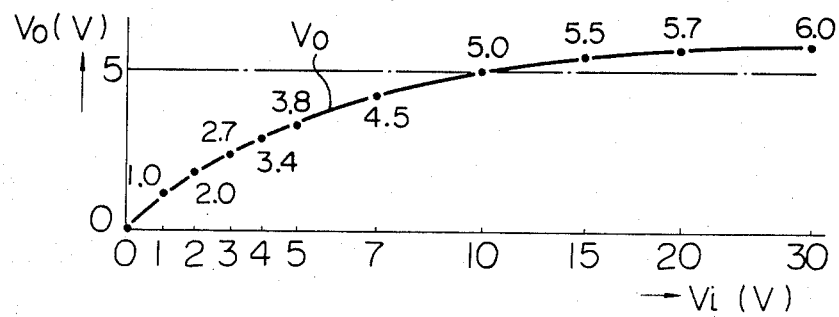

As illustrated by the straight line R(41) in FIG. 4A, the resistance r of the diffusion resistance element 41 is constant with respect to the change of the input voltage $V_i$. The resistance R(42) of the transistor 42 is approximately infinite where the input voltage $V_i$ is less than the gate threshold voltage $V_{th}$ of the transistor 42, because the transistor 42 is in the OFF state while the gate voltage $V_i$ of the transistor 42 is less than the gate threshold voltage $V_{th}$.

As the voltage $V_i$ is increased to exceed the voltage $V_{th}$, the drain current of the transistor 42 starts to flow. For example, the circuit is designed such that the resistance R(42) of the transistor 42 is approximately equal to the resistance r of the diffusion resistance element 41 when the voltage $V_i$ is 10 volts.

Under such a condition, the output voltage $V_O$ becomes half of the input voltage $V_i$, i.e., 5 volts. Even if the input voltage $V_i$ is increased to exceed 10 volts, the output voltage $V_O$ does not exceed 5 volts by much.

The curve $V_O$ represents the relation between $V_O$ and $V_i$ on the basis of the equations set forth below.

The drain current $I_d$ of the transistor 42 is expressed by equation (1), where $V_g$ is the gate voltage, $V_d$ is the drain voltage, and $\beta$ is a predetermined constant:

$$I_d = \beta [(V_g - V_{th}) V_d - \tfrac{1}{2} V_d^2] \tag{1}$$

in the triode range, where $V_g > V_d$, of a MOS transistor. Accordingly, equation (2) is expressed as follows with regard to the MOS transistor 42 in the circuit of FIG. 3.

$$I_d = \beta [(V_i - V_{th}) V_O - \tfrac{1}{2} V_O^2] \tag{2}$$

The current $I_r$ through the diffusion resistance element 41 is expressed as equation (3) below.

$$I_r = (V_i - V_O)/r \tag{3}$$

From equations (2) and (3) and the fact that $I_d$ is equal to $I_r$, equation (4), representing the relation between $V_O$ and $V_i$, is obtained.

$$V_O = \frac{1}{\beta r} + V_i - V_{th} - \sqrt{\left(\frac{1}{\beta r} + V_i - V_{th}\right)^2 - \frac{2V_i}{\beta r}} \tag{4}$$

By calculating the value $V_O$ according to equation (4) under the conditions that the gate threshold voltage $V_{th}$ is 1 volt and that $V_O$ is 5 volts when $V_i$ is 10 volts, the curve $V_O$ in FIG. 4B is obtained. The curve $V_O$ in FIG. 4B has been verified by the results of experiments carried out by the inventor.

Figure 5:
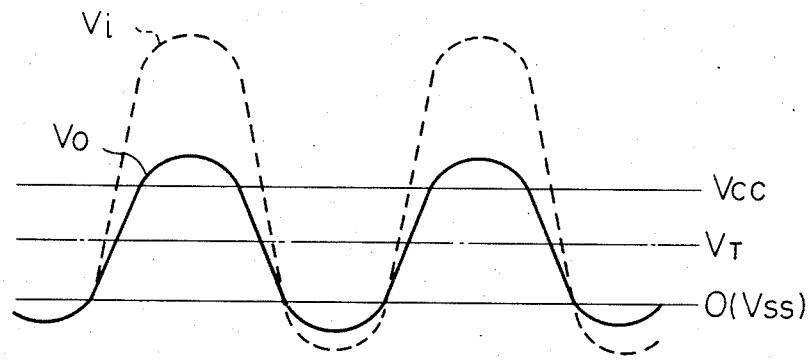

Thus, in the oscillator device of FIG. 3, the voltage $V_O$ is limited with approximately 5 volts even when the voltage $V_i$ exceeds 10 volts, as illustrated in FIG. 5. Hence, the output signal having the waveform with a duty ratio of 50% is obtained at the point 13 in the output line of the amplifier circuit 1.

Although N-channel MOS transistors are used for the amplifier circuit portion of the oscillator device of FIG. 3, it is also possible to use P-channel MOS transistors.

I claim:

1. An oscillator circuit, comprising:

an amplifier circuit means having input and output ends for generating an oscillation output signal at said output end, said amplifier circuit means being a MOS inverter;

feedback circuit means, operatively connected to said output end of said amplifier circuit means, for generating a feedback signal, having first and second polarities, in response to said oscillation output signal, an excess potential of said feedback signal having the first polarity being suppressed by said amplifier circuit means; and gain correction circuit means, operatively connected to said input end of said amplifier circuit means, for receiving the feedback signal, said gain correction circuit means including a voltage division circuit for dividing the feedback signal and supplying said divided feedback signal to said input end of said amplifier circuit means, said voltage division circuit including:

impedance means, operatively connected to said input end of said amplifier circuit means, for providing an impedance to said amplifier circuit means; and a transistor, operatively connected to said impedance means and said feedback circuit means, having a control input terminal to which the feedback signal is supplied, an excess potential of the feedback signal having the second polarity being suppressed by changing a voltage division ratio of said voltage division circuit, thereby attaining a predetermined duty ratio.

2. An oscillator circuit as defined in claim 1, wherein said feedback circuit means includes a resonator element.

3. An oscillator circuit as defined in claim 1, wherein said feedback means comprises:

a resistor operatively connected to said output end of said amplifier circuit means and said gain correction circuit means; and a resonator operatively connected in parallel with said resistor and having first and second ends.

4. An oscillator circuit comprising:

amplifier circuit means having input and output terminals for generating an oscillator output signal at the output terminal, said amplifier circuit means being a MOS inverter;

feedback circuit means, operatively connected to the output terminal of said amplifier circuit means, for generating a feedback signal, having first and second polarities in response to the oscillation output signal, said amplifier circuit means suppressing an excess potential of the feedback signal having the first polarity; and gain correction circuit means, operatively connected to the input terminal of said amplifier circuit means, for receiving the feedback signal, said gain correction means including:

a voltage division circuit, operatively connected to said feedback circuit means, for dividing the feedback signal and supplying the divided feedback signal to the input terminal of said amplifier circuit means, said gain correction means suppressing an excess potential of the feedback signal having the second polarity by changing a division ratio of the voltage division circuit in accordance with the voltage level of the feedback signal, thereby attaining a predetermined duty ratio.

* * * * *